United States Patent
Kuriyama

(10) Patent No.: US 7,499,094 B2
(45) Date of Patent: Mar. 3, 2009

(54) SOLID STATE IMAGING DEVICE INCLUDING ANNULAR AND CENTER LENS IN CONTACT WITH EACH OTHER

(75) Inventor: Toshihiro Kuriyama, Otsu (JP)

(73) Assignee: Panasonic Corporation, Osaka (JP)

( * ) Notice: Subject to any disclaimer, the term of this patent is extended or adjusted under 35 U.S.C. 154(b) by 929 days.

(21) Appl. No.: 10/824,427

(22) Filed: Apr. 15, 2004

(65) Prior Publication Data

US 2004/0257460 A1 Dec. 23, 2004

(30) Foreign Application Priority Data

Jun. 18, 2003 (JP) .............................. 2003-173946

(51) Int. Cl.
*G02B 13/16* (2006.01)
*G02B 3/08* (2006.01)
(52) U.S. Cl. .................... 348/340; 348/335; 359/742
(58) Field of Classification Search ................ 348/340; 359/708, 742, 743, 652
See application file for complete search history.

(56) References Cited

U.S. PATENT DOCUMENTS

| 4,643,752 | A | * | 2/1987 | Howard et al. ................. 65/399 |
| 4,689,652 | A | * | 8/1987 | Shimada et al. ............. 257/443 |
| 6,221,687 | B1 | * | 4/2001 | Abramovich ................ 438/70 |
| 6,599,305 | B1 | * | 7/2003 | Feingold ..................... 606/166 |

FOREIGN PATENT DOCUMENTS

JP  2000-164837  6/2000

* cited by examiner

*Primary Examiner*—Tuan V Ho
*Assistant Examiner*—Chia-Wei A Chen
(74) *Attorney, Agent, or Firm*—McDermott Will & Emery LLP

(57) ABSTRACT

Each intralayer lens disposed between a color filter 120 and photoelectric conversion sections has a Fresnel lens structure composed of a center lens 132 and an annular lens 134. As a result, the thickness of the intralayer lenses is reduced, and positions of upper lenses can be lowered without having to reduce the thickness of a color filter.

6 Claims, 13 Drawing Sheets

F I G. 1
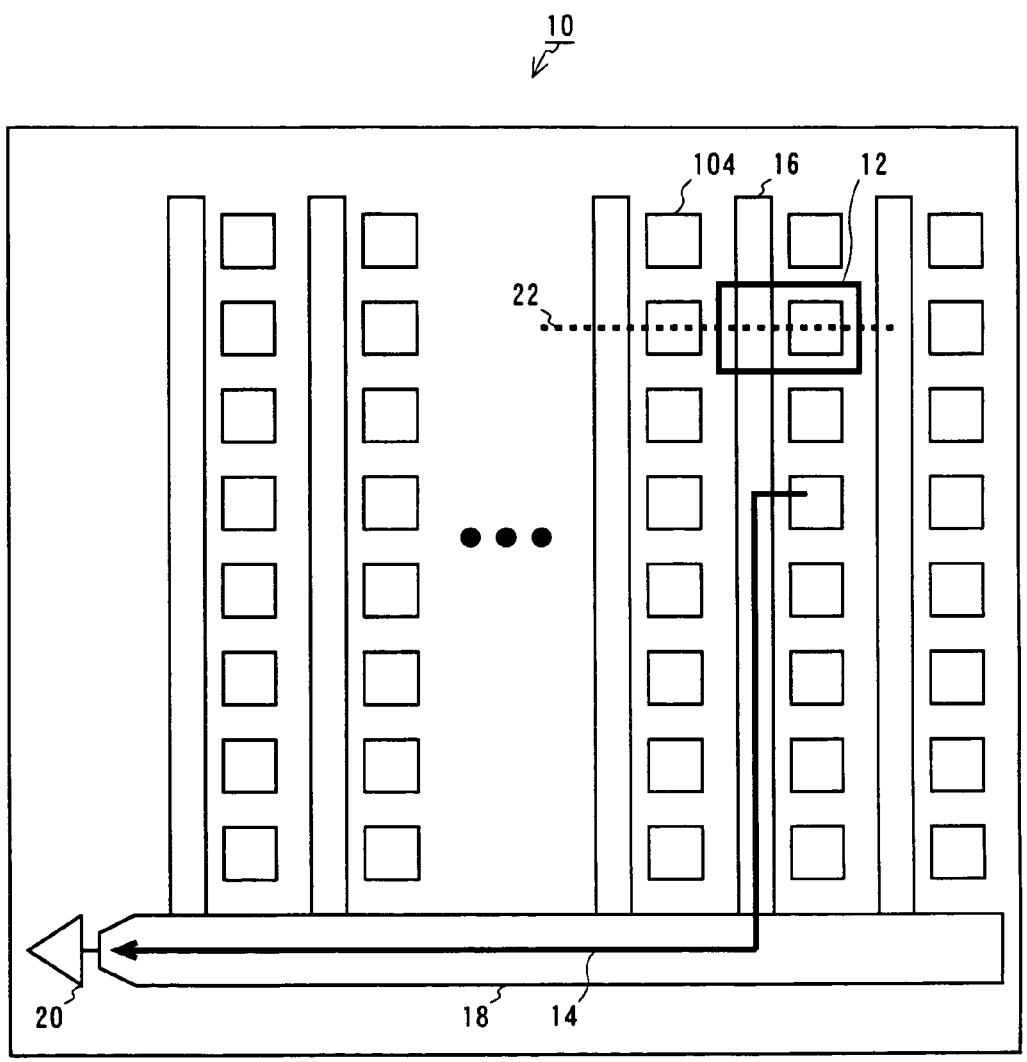

F I G. 2
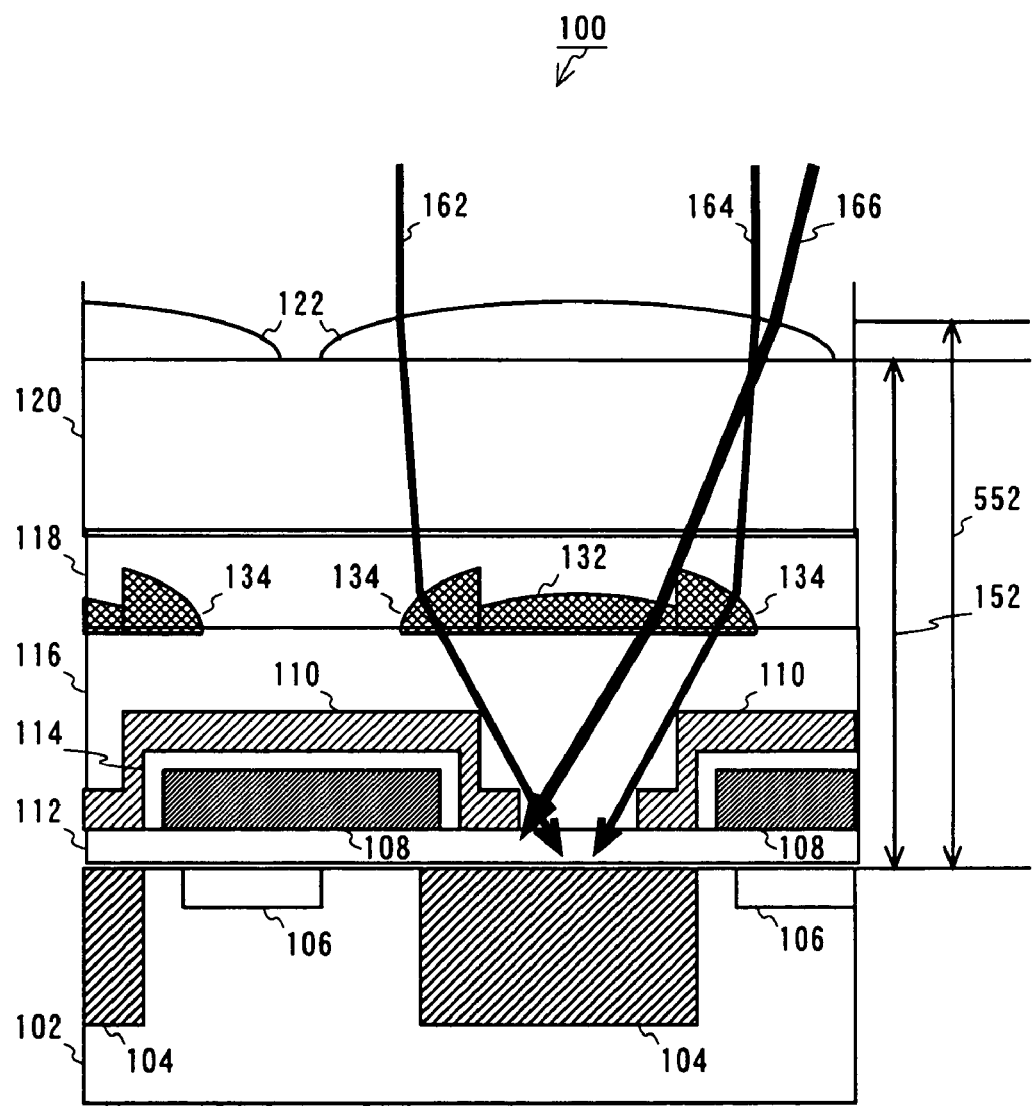

F I G. 3
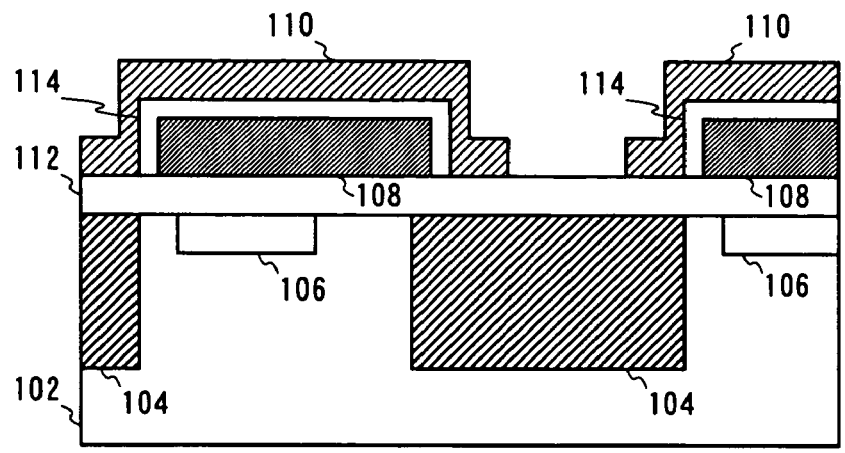
F I G. 4
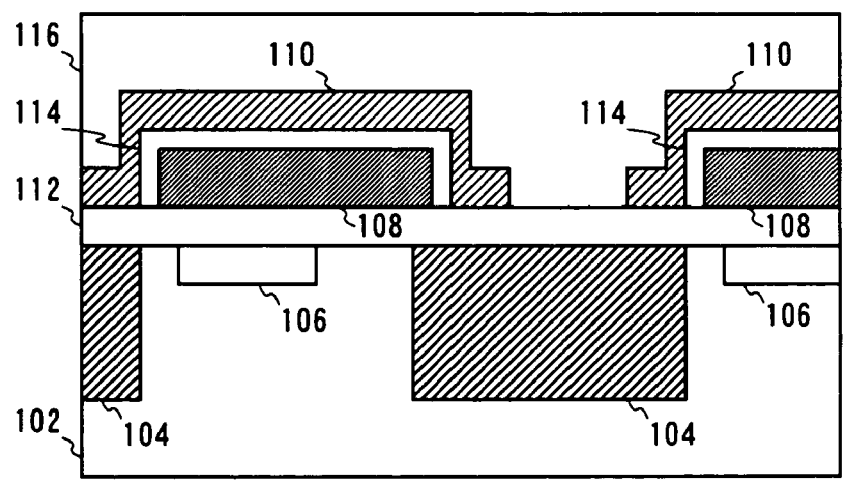

F I G. 1 6
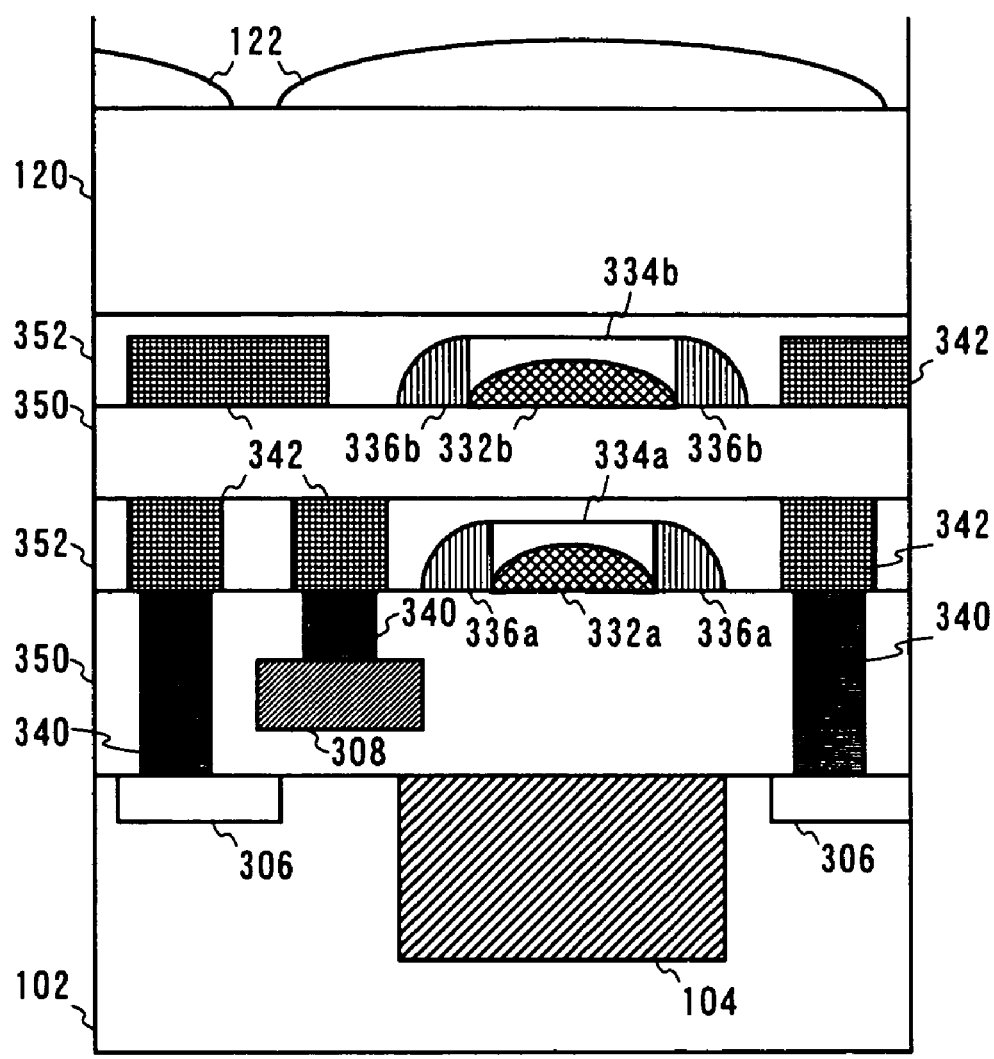

SOLID STATE IMAGING DEVICE INCLUDING ANNULAR AND CENTER LENS IN CONTACT WITH EACH OTHER

BACKGROUND OF THE INVENTION

1. Field of the Invention

The present invention relates to a solid-state imaging device and a method for producing the same. More particularly, the present invention relates to: a solid-state imaging device in which a pixel-by-pixel array of photoelectric conversion sections generate electrical charges in accordance with an amount of incident light (as in the case of a CCD, or "Charge Coupled Device"), and the electrical charges generated by the photoelectric conversion sections are respectively transferred by charge transfer sections for outputting an electrical signal; and a method for producing such a solid-state imaging device.

2. Description of the Background Art

In recent years, solid-state imaging devices (e.g., CCDs) have seen remarkable improvements in terms of increase in the number of pixels and downsizing of the device. In a solid-state imaging device in general, as compared to the area of each pixel, a corresponding aperture provided in a photoshield film, which is provided above the photodiode sections, is relatively small. Moreover, as the pixel size decreases (for example, to about 3 μm×3 μm or less), the absolute amount of light which is received by each photodiode section becomes more reduced as compared to conventional cases. Therefore, any incoming light for each pixel must be efficiently led through the corresponding aperture.

In order to efficiently collect the incoming light for each pixel onto an aperture, a conventional solid-state imaging device is provided with microlenses (hereinafter referred to as "upperlenses"), which are disposed upon a color filter. Recently, in order to further enhance the focal power and attain improved sensitivity, it is coming into practice to provide microlenses (hereinafter referred to as an "intralayer lens") not only above but also below the color filter (see for example, Japanese Patent Laid-Open Publication No. 2000-164837 (page 7, FIG. 1)). By employing such two groups of two microlenses, there is also provided an additional advantage of reducing wavelength-dependent displacement of focal points due to chromatic aberration.

FIG. 18 shows an exemplary cross-sectional structure of a conventional solid-state imaging device which includes upper lenses and intralayer lenses. In FIG. 18, a photoshield metal film 110 prevents gate electrodes 108 and charge transfer sections 106 from being irradiated with light. In order to allow light to impinge on photodiode sections 104, the photoshield metal film 110 has apertures formed above the respective photodiode sections 104. Each upper lens 122 and intralayer lens 530 converge light onto a corresponding photodiode section 104. A color filter 120 is provided between the layer of upper lenses 122 and the layer of intralayer lenses 530.

A distance 552 from the surface of each photodiode section 104 to each upper lens 122 is preferably short. As the distance 552 becomes longer, problems will emerge such as light which has been led through the upper lens 122 and the intralayer lens 530 being intercepted by the photoshield metal film 110, or light leaking into adjoining pixels. For example, in the solid-state imaging device shown in FIG. 18, among light rays 562, 564, and 566 which have traveled through an upper lens 530, the ray 566 is intercepted by the photoshield metal film 110. If this happens, the amount of light which is received by the photodiode section 104 becomes smaller than the amount of light entering through the upper lens 122. If the ray 566 which has been intercepted by the photoshield metal film 110 somehow (directly or by reflection) strays into another pixel, the problem of intermixing of colors will occur.

Reducing the thickness of the color filter 120 to decrease the distance 552 from the surface of the photodiode section 104 to the upper lens 122 is not preferable because it will result in a degradation of the spectrometric characteristics. The color filter 120 needs to have a certain thickness or more in order to attain predetermined spectrometric characteristics, and thus, the distance between the upper lens 122 and intralayer lens 530 cannot be reduced beyond the constraints imposed by the thickness requirement for the color filter 120. This in turn hinders reduction in the distance 552 from the surface of the photodiode section 104 to the upper lens 122. Furthermore, if the distance between the upper lens 122 and the intralayer lens 530 is increased due to the thickness requirement of the color filter, the curvature of the intralayer lens 530 must be made greater than the curvature of the upper lens 122. If, conversely, the curvature of the upper lens 122 is greater than the curvature of the intralayer lens 530, a diffused component of the light which has been excessively throttled or focused by the upper lens 122 will strike the intralayer lens 533, thus making it difficult to create a convergence spot on the surface of the photodiode section 104. In order to increase the curvature of the intralayer lens 530, it is necessary to increase the thickness of the intra layer lens 530. Increasing the thickness of the intralayer lens 530, however, leads to a further elongation of the distance 552 from the surface of the photodiode section 104 to the upper lens 122.

SUMMARY OF THE INVENTION

Therefore, an object of the present invention is to provide a solid-state imaging device which has an enhanced sensitivity and a reduced size while being able to reduce intermixing of colors, and a method for producing the same.

The present invention has the following features to attain the object mentioned above.

The present invention is directed to a solid-state imaging device (typically a CCD) in which a pixel-by-pixel array of photoelectric conversion sections each generate an electrical charge in accordance with an amount of light entering the photoelectric conversion section, and the electrical charges generated by the photoelectric conversion sections are converted to an electrical signal to be output, comprising a color filter layer, upper lenses, and intra layer lenses. The color filter layer is disposed above the photoelectric conversion sections, allowing light of a specific wavelength to pass therethrough. The upper lenses are disposed above the color filter layer, causing incident light to be converged so as to enter the color filter layer. The intralayer lenses are disposed between the color filter layer and the photoelectric conversion sections, each intralayer lens causing the light converged by each upper lens to be further converged so as to enter a corresponding one of the photoelectric conversion sections. One feature of the present invention is that the intralayer lenses have a Fresnel lens structure. By adopting such a lens structure, the thickness of the intralayer lenses can be reduced even though the curvature thereof is increased, and the distance from the surface of the photoelectric conversion sections to the upper lenses can be reduced. As a result, light leaking into adjoining pixels is reduced, whereby intermixing of colors is prevented. Thus, there is realized a solid-state imaging device which has reduced color unevenness and flicker. Furthermore, since light which obliquely enters the upper lenses can be efficiently converged to the photoelectric conversion sections, clear images can be obtained even with a large camera lens aperture.

Each intralayer lens having a Fresnel lens structure may typically include: a center lens and at least one annular lens disposed on the outside of the center lens. The center lens has a circular and curved surface whose center is on an optical axis of the center lens. The at least one annular lens is disposed on the outside of the center lens, and has a annular and belt-like face which is concentric to the center lens with respect to the optical axis. The center lenses and the annular lenses can be imparted with different refractive indices depending on their materials. For example, the refractive indices of the center lens and the at least one annular lens may increase or decrease toward outside and away from the optical axis of the center lens. By thus differentiating the refractive indices of the lenses, it becomes possible to confer various optical properties to the intralayer lenses depending on the needs. A width of the at least one annular lens along a radius direction thereof may decrease toward outside and away from the optical axis of the center lens. As a result, the height of the intralayer lenses can be kept minimum. As one example, each intralayer lens may comprise SiN (silicon nitride).

The present invention is also directed to methods for producing a solid-state imaging device having the aforementioned structure. According to a first method, an insulative film is formed above a layer of the photoelectric conversion sections. Lenses are formed above the insulative film, each lens being immediately above a corresponding one of the photoelectric conversion sections. A resist layer is formed so as to cover the insulative film and the lenses. A cylindrical hole is formed in the resist layer so as to be located above each lens, each hole having a circular bottom face centered around an optical axis of the lens and having a diameter smaller than a diameter of the lens. An interior of the hole is etched in a manner to retain a surface configuration of a central portion of the lens. Then, the resist layer is removed.

According to a second method, an insulative film is formed above a layer of the photoelectric conversion sections. Center lenses are formed above the insulative film, each lens being immediately above a corresponding one of the photoelectric conversion sections and having a diameter which is about 50% to about 70% of a period with which the pixels are formed. A planarizing film is formed to provide a planar surface covering the center lenses, the planarizing film comprising a material having a smaller refractive index than that of the center lenses. A cylindrical piece of resist is formed on the surface of the planarizing film so as to be located above each center lens, each resist piece having a circular bottom face centered around an optical axis of the center lens and having a diameter equal to a diameter of the center lens. The planarizing film is removed except for portions lying below the resist pieces. A lens film of a lens material is formed so as to cover the insulative film and the planarizing film. Then, a side wall is formed to become an annular lens surrounding each center lens, by etching the lens film to a sufficient depth to expose the planarizing film.

A sequence of steps for forming the side wall may be repeated a plurality of times to form a plurality of annular lenses surrounding each center lens. In this case, the side walls may be formed such that the plurality of annular lenses have the same refractive index. Alternatively, the side walls may be formed such that the plurality of annular lenses have at least two different refractive indices. Alternatively, the side walls may be formed such that a width of each annular lens along a radius direction thereof decreases toward outside and away from the optical axis of the center lens.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a solid-state imaging device according to a first embodiment of the present invention;

FIG. 2 is a cross-sectional view showing an Si substrate with features involved in charge transfer having been formed therein or thereon;

FIG. 3 is a cross-sectional view showing a substrate having photodiode sections and charge transfer sections formed therein, with gate electrodes, an interlayer insulative film and a photoshield metal film being further formed;

FIG. 4 is a cross-sectional view showing the substrate of FIG. 3 with an insulative film formed thereon;

FIG. 16 is a cross-sectional view showing a MOS-type solid-state imaging device including intralayer lenses provided between wiring layers;

DESCRIPTION OF THE PREFERRED EMBODIMENTS

First Embodiment

Figure 5:
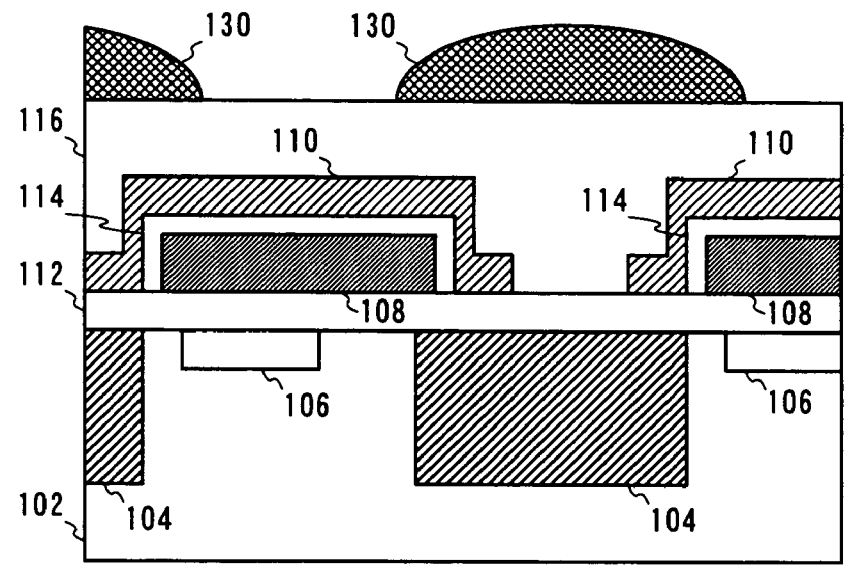
FIG. 5 is a cross-sectional view showing the substrate of FIG. 4, with intralayer lenses formed thereon.

FIG. 1 is a schematic plan view showing a solid-state imaging device according to a first embodiment of the present invention. FIG. 1 mainly shows features involved in charge transfer. The solid-state imaging device includes a plurality of pixels. In FIG. 1, an area occupied by a single pixel is represented as a unit pixel 12. Photodiode sections 104, which function as photoelectric conversion sections, generate electrical charges in accordance with the intensity of the light received thereby. Each vertical CCD 16 receives from a plurality of pixels the electrical charges generated by the respective photodiode sections 104, and transfers the electrical charges. A horizontal CCD 18 receives the electrical charges from the vertical CCDs 16, and transfers the electrical charges to an output amplifier 20. A flow of the signal charge is indicated by an arrow 14.

FIG. 2 is a schematic cross-sectional view showing the solid-state imaging device according to the first embodiment, taken at dotted line 22 in FIG. 1. Unless otherwise specified, the following description will be directed to a single pixel; it will be appreciated that the following description and illustrations will similarly apply to any adjoining pixel, of which description is omitted. Hereinafter, the first embodiment of the present invention will be described with reference to FIG. 2. Although the present embodiment illustrates an interline CCD solid-state imaging device, the present invention is also applicable to any other type of solid-state imaging device, e.g., a MOS-type solid-state imaging device.

As shown in FIG. 2, the solid-state imaging device 100 according to the present invention is constructed on an Si (silicon) substrate 102. The photodiode sections 104, which are formed on the Si substrate 102, generate electrical charges in accordance with the intensity of the light received thereby. Each charge transfer section 106 formed on the Si substrate 102 transfers a current generated by the corresponding photodiode section 104. A gate electrode 108 is disposed on the Si substrate 102 so as to adjoin each photodiode section 104, and serves as a switch for transferring the electrical charge generated by the photodiode section 104 to the corresponding charge transfer section 106. A photoshield metal film 110 is formed so as to cover each entire gate electrode 108 and to partially cover the photodiode sections 104. The photoshield metal film 110 prevents the gate electrodes 108 from being irradiated with light.

A MOS gate insulative film 112, which is formed between the layer of gate electrodes 108 and the Si substrate 102, provides electrical insulation between the two. An interlayer insulative film 114 provides electrical insulation between the gate electrodes 108 and the photoshield metal film 110. An insulative film 116 is deposited on the Si substrate 102 having the aforementioned features, so as to overlie the entire upper face thereof.

Each set of an upper lens 122, a center lens 132, and an annular lens 134 causes incident parallel light to be converged in the neighborhood of the surface of the corresponding photodiode section 104. Note that the center lens 132 and the annular lens 134 together constitute an intralayer lens having a Fresnel lens structure. The center lens 132 is a near-paraboloidal or spherical lens. The annular lens 134 may have, for example, a face composed of an annular or belt-like fraction taken from a paraboloid or sphere.

As is well known, a Fresnel lens structure includes concentric belt-like regions around its optical axis, such that the central portion and the peripheral portion have substantially the same thickness, thus reducing the internal volume of the lens while retaining a spherical or a spherical lens surface contour. As a whole, a Fresnel lens structure appears substantially planar. Since the distance to be traveled by light within the lens is reduced, the Fresnel lens structure provides an advantage of reducing aberration and the like. It is also possible to impart different belt-like portions of a Fresnel lens with different curvatures or different refractive indices. In general, though, different portions of the lens have the same focal point.

Since it is difficult to obtain a lens having a strictly spherical shape, it is often the case that each intralayer lens has a paraboloidal surface. In most cases, the optical axis of each intralayer lens passes through the center of an aperture corresponding to a photodiode section. In some cases, however, the optical axis of each intralayer lens may intentionally be displaced from the center of an aperture corresponding to a photodiode section, in order to prevent blurring from occurring at the periphery of the solid-state imaging device.

The center lenses 132 and the annular lenses 134 are composed of a film of silicon nitride formed by plasma CVD (chemical vapor deposition) technique or the like (P—SiN: plasma silicon nitride). A planarizing film 118 is formed so as to cover the center lenses 132 and the annular lenses 134. A color filter 120, which allows light of specific wavelengths to pass therethrough (such as red, green, and blue), is formed on the upper face of the planarizing film 118.

FIGS. 3 to 8 are schematic cross-sectional views illustrating different steps in a production process of the solid-state imaging device shown in FIG. 2. Hereinafter, referring to FIG. 2 and FIGS. 3 to 8, a method for producing the solid-state imaging device according to the first embodiment will be described.

FIG. 3 shows features formed in or on the Si substrate 102 which enable charge transfer in the solid-state imaging device. First, desired impurity diffusion layers are formed in the Si substrate 102 by using methods such as ion implantation. Ion implantation is a technique by which a substrate is bombarded with ions which have been accelerated with high energy, thereby imparting the semiconductor substrate with a p- or n-nature. Thus, the photodiode sections 104 and the charge transfer sections 106 are formed.

Next, by using a thermal oxidation or CVD technique, the MOS gate insulative film 112 is deposited. The MOS gate insulative film 112 may have, for example, an ONO ($SiO_2$—SiN—$SiO_2$) structure.

Next, the gate electrodes 108 are deposited by CVD technique. Then, by using a photolithography or dry etching process, etc., a necessary pattern (not shown) is obtained. Then, an electrode insulative film (not shown) is deposited by an oxidation/CVD technique or the like. Next, although not shown in FIG. 3, a second gate electrode is deposited and processed. Note that the above step is to be repeated in the case of employing an electrode structure comprising three or more layers. Then, upon this two-layered electrode structure, the interlayer insulative film 114 is deposited by oxidation/CVD technique. Next, the photoshield metal film 110 is deposited in areas except above the center of each photodiode section 104.

FIG. 4 shows an insulative film being further formed on the features for enabling charge transfer in the solid-state imaging device. After the photo shield metal film 110 is deposited, the insulative film 116 is deposited thereupon. The insulative film 116 serves not only as a means of insulation but also as a means for planarizing the device surface. As the insulative film 116, BPSG (boro-phospho-silicate glass), which is a type of silicon oxide containing boron (B) and phosphorus (P), may be used, for example.

In general, the production process of a semiconductor device includes steps for planarizing the device surface in order to prevent problems such as disruption of wiring due to high density mounting. For example, an insulative BPSG film may be formed on the device surface by CVD technique, and thereafter a thermal process (reflow), which applies heat to confer fluidity, or a CMP (chemical-mechanical polishing) process, which involves physically polishing the device by using a polish liquid, may be performed to planarize the device surface. In a thermal process, the use of boron-and-phosphorus-containing BPSG is known to provide a better planarization effect than in the case of using pure silicon oxide.

FIG. 5 is a cross-sectional view showing the device of FIG. 4 with lenses 130 formed thereon. As a method for forming the lenses 130, a P—SiN layer is first formed by plasma CVD technique. Next, by using photolithography technique, a resist layer is selectively formed in desired sizes and positions. Usually, a columnar-shaped resist layer is formed above the aperture corresponding to each pixel. Next, a thermal process is performed to melt the resist, whereby lens-shaped resist portions are formed due to the surface tension of the resist. Then, under a condition where the etching rates for P—SiN and the resist are equal, a dry etching is performed until the resist is completely eliminated. As a result, the lens shapes of the resist are transcribed onto the P—SiN. In other words, lens-shaped portions of P—SiN are formed below where the lens-shaped resist portions existed. As an etching gas, a gaseous mixture of carbon tetrafluoride, oxygen, and argon may be used.

Figure 6:
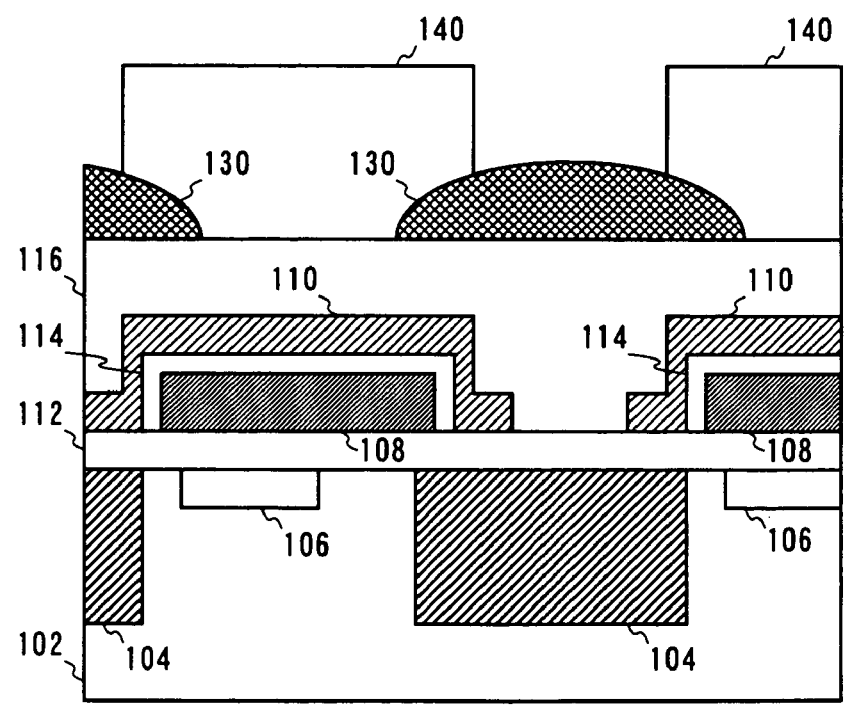
FIG. 6 is a cross-sectional view showing the substrate of FIG. 5, with a holed resist layer formed thereon.

FIG. 6 shows the device of FIG. 5 with a resist film 140 having a desired shape formed thereon. After the lenses 130 are formed, a resist film is formed so as to cover the lenses 130. Next, the resist is etched so as to form cylindrical holes. The cylindrical holes thus formed are made concentric with the respectively lenses 130, and have bottom faces with a diameter smaller than that of the lenses 130.

Generally speaking, if the intralayer lenses are too small, the amount of light which cannot be converged by the intralayer lenses increases. On the other hand, if the intralayer lenses are too large, the amount of light which cannot converged to the apertures corresponding to the photodiode sections increases. Therefore, from the perspective of allowing for easy processing and converging, it is preferable that the diameter of the bottom face of each hole is just large enough to cover the aperture corresponding to the photodiode section, e.g., 50% to 70% of the pixel size (or the period with which the pixels are formed).

Figure 7:
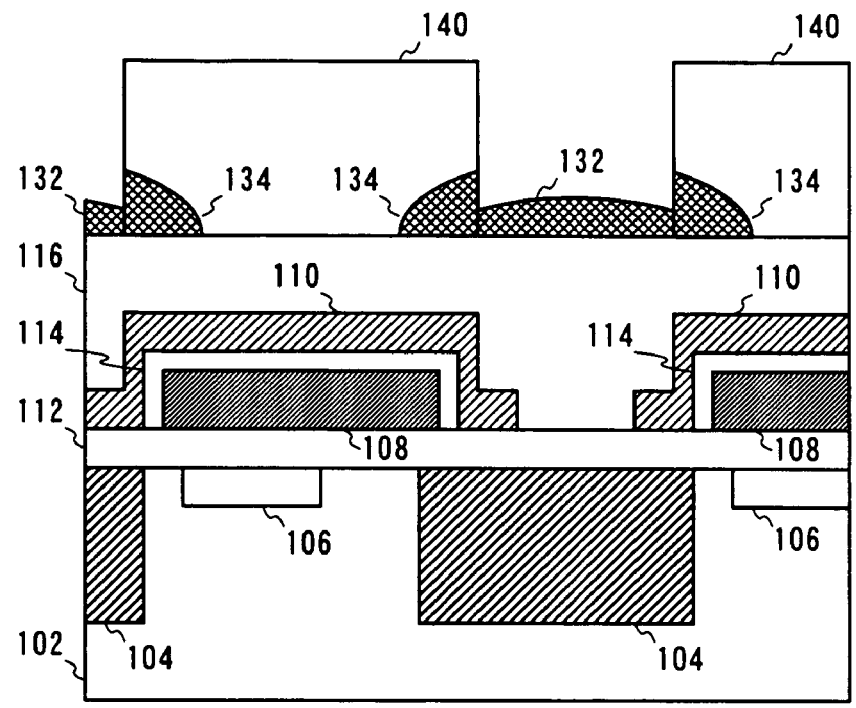
FIG. 7 is a cross-sectional view showing the lenses shown in FIG. 6 having been etched.

FIG. 7 shows the device of FIG. 6 having been etched. Of each lens 130 shown in FIG. 6, the portion lying beneath the hole (where the lens 130 is not covered with the resist) is etched. This etching is performed so as to result in a uniform erosion in the depth direction, such that the surface shape of the lens 130 is maintained. As a result, the center lens 132 and the annular lens 134 are formed. Next, the resist 140 is removed by etching.

Figure 8:
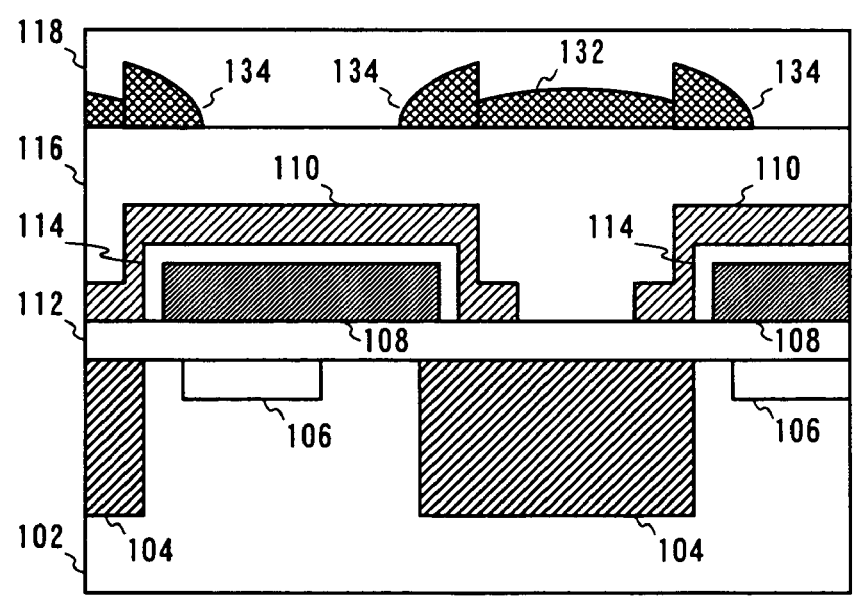
FIG. 8 is a cross-sectional view showing the substrate of FIG. 7 from which the resist has been removed, with a planarizing film being formed thereon.

FIG. 8 shows how the device of FIG. 7 is planarized. After the center lenses 132 and the annular lenses 134 have been formed, the planarizing film 118 is formed so as to cover the center lenses 132 and the annular lenses 134, thus planarizing the device surface. The planarizing film 118 may be composed of any transparent material, which may be organic or inorganic.

Next, a color filter and upper lenses are further formed on the device of FIG. 8 (see FIG. 2). First, the color filter 120 is formed on the planarized surface of the device. The color filter 120 may be formed by a dyeing method (which involves dyeing an organic substrate with a dye), or a color resist application method (which involves applying a pigment-containing resist and etching). The color filter formation step is repeatedly performed for each of the colors composing the color filter 120, until a desired coloration pattern corresponding to the positional arrangement of the pixels (color coding) is obtained.

Next, the upper lenses 122 are formed on the color filter 120. In general, the upper lenses 122 are formed by a method which involves: depositing a film of transparent resin which melts with heat; thereafter etching the resin film into rectangular portions; and heating the resin to confer fluidity thereto, so that lens-shaped resin portions are formed due to the surface tension of the resin. Another known method deposits the upper lenses 122 through a resist thermal reflow transcription or the like.

According to the present embodiment, as shown in FIG. 2, the distance from the surface of the Si substrate 102 to each upper lens 122 can be reduced from the conventional distance 552 to the distance 152. As a result, not only parallel rays 162 and 164, but also oblique light 166 entering from an end of the lens can also be converged to the aperture corresponding to the photodiode section 104.

Second Embodiment

Figure 9:
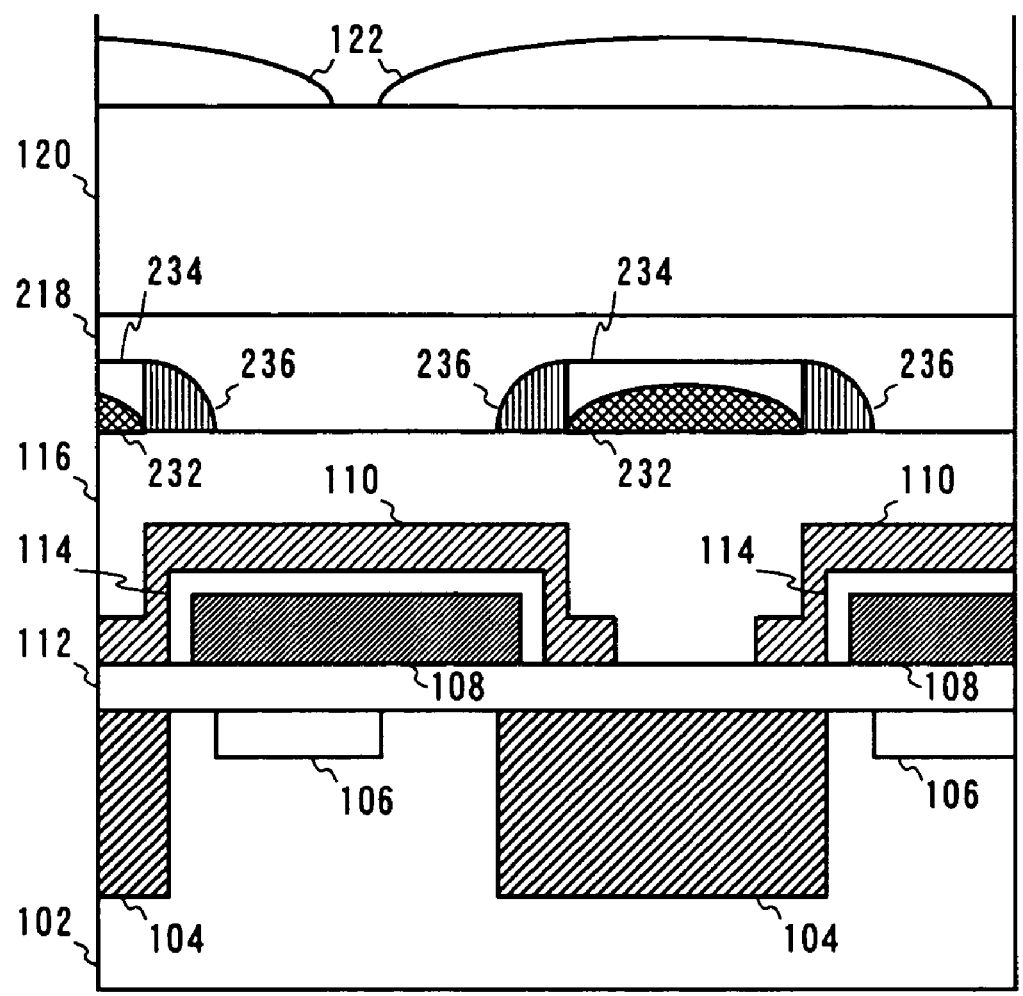
FIG. 9 is a cross-sectional view showing a solid-state imaging device according to a second embodiment of the present invention.

FIG. 9 is a schematic cross-sectional view showing a solid-state imaging device according to a second embodiment of the present invention. Hereinafter, the second embodiment of the present invention will be described with reference to FIG. 9. Although the present embodiment illustrates an interline CCD solid-state imaging device, the present invention is also applicable to any other type of solid-state imaging device, e.g., a MOS-type solid-state imaging device.

As shown in FIG. 9, the solid-state imaging device according to the present embodiment includes an Si substrate 102, photodiode sections 104, charge transfer sections 106, gate electrodes 108, a photoshield metal film 110, a MOS gate insulative film 112, an interlayer insulative film 114, an insulative film 116, upper lenses 122, and a color filter 120, which are identical to their respective counterparts in the first embodiment. The descriptions of such features will be omitted.

In the present embodiment, each set of an upper lens 122, a center lens 232, and an annular lens 236 causes incident light to be converged onto the corresponding photodiode section 104. Note that the center lens 232 and the annular lens 236 together constitute an intralayer lens having a Fresnel lens structure. The center lens 232 and the annular lens 236 have different refractive indices from each other. The center lens 232 and the annular lens 236 are composed of materials such as P—SiN.

In the solid-state imaging device according to the present embodiment, the center lenses 232 and the annular lenses 236 are composed of different materials such that the center lens 232 and the annular lens 236 have different refractive indices from each other. The specific production method will be described later. For example, the focal length of the lens employed in the central portion of the Fresnel lens structure can be made different from the focal length of the annular lens. As a result, a spherical lenses with an improved focal power can be provided as compared with the case where the intralayer lenses are formed from a single material.

Figure 10:
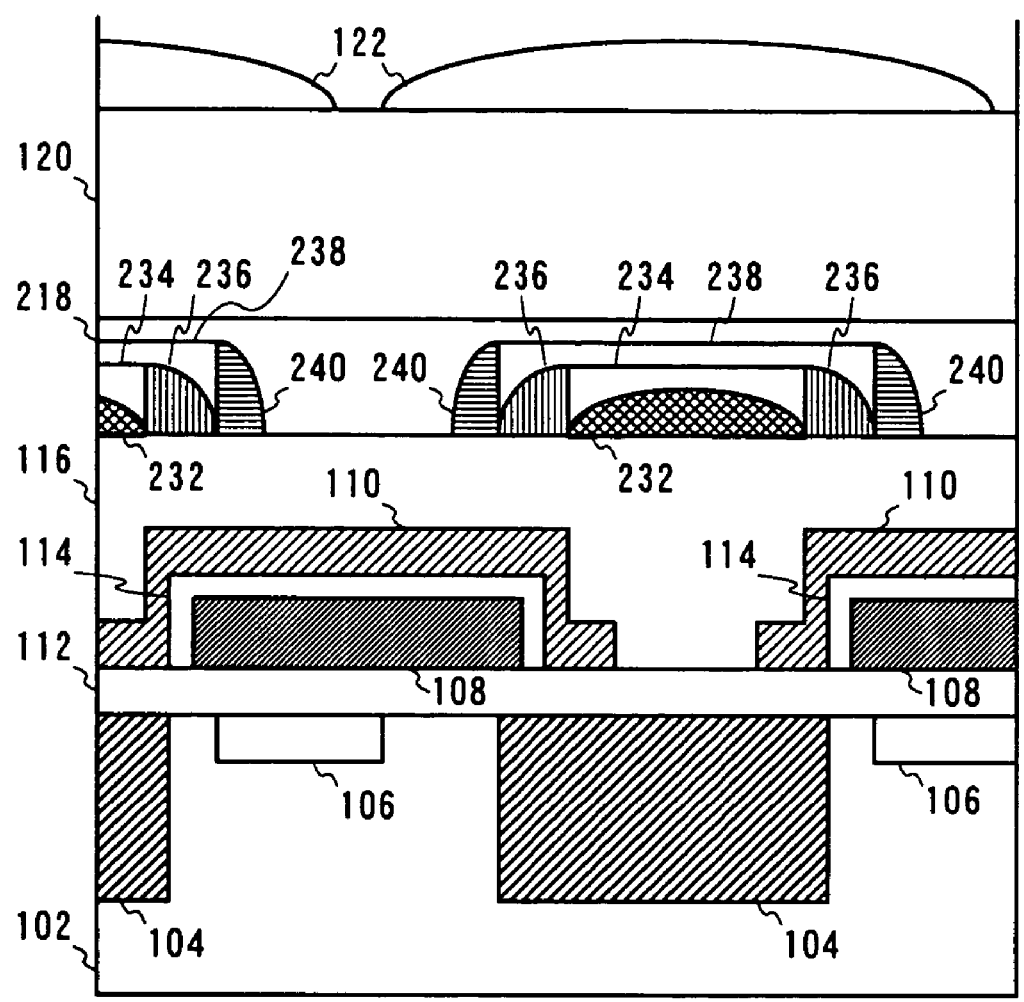
FIG. 10 is a cross-sectional view showing a solid-state imaging device according to the second embodiment, with a plurality of side walls formed.

FIG. 10 shows intralayer lenses of a Fresnel lens structure, each having a center lens 232 provided in the center, an annular lens 236 surrounding the center lens 232, and another annular lens 240 surrounding the annular lens 236. As shown in FIG. 10, by constructing each intralayer lens from multiple lens portions having different refractive indices, the entire intralayer lens can be brought closer to an ideal lens as desired.

FIGS. 11 to 15 are schematic cross-sectional views illustrating different steps in a production process of the solid-state imaging device shown in FIG. 9. Hereinafter, referring to FIG. 9 and FIGS. 11 to 15, a method for producing the solid-state imaging device according to the second embodiment will be described. As for the steps down to the formation of the insulative film 116 on the Si substrate 102 (resulting in the device as shown in FIG. 3), the process is identical to the production process of the solid-state imaging device according to the first embodiment. Therefore, the description of this first portion will be omitted.

Figure 11:
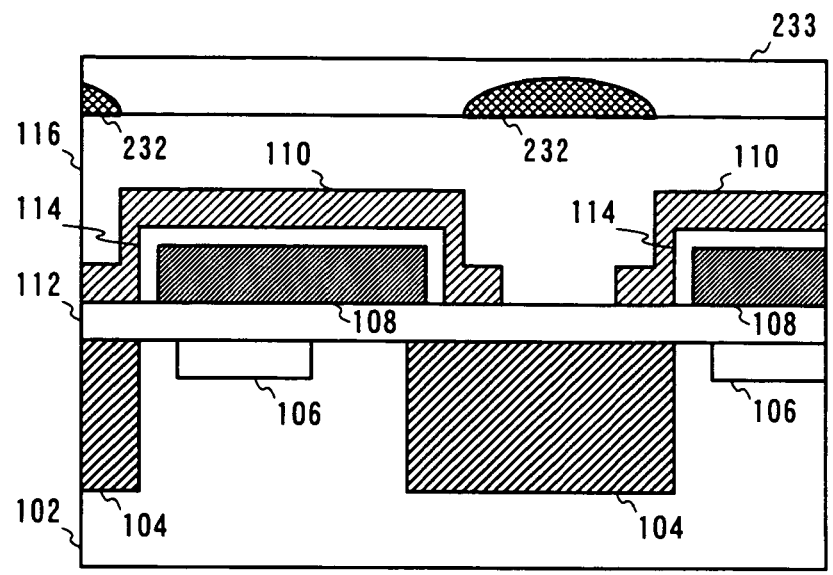
FIG. 11 is a cross-sectional view showing the substrate of FIG. 10, with a planarizing film being formed over the intralayer lenses.

FIG. 11 shows the device of FIG. 4 with center lenses and a planarizing film being formed thereon. As in the first embodiment, it is preferable that the diameter of the center lenses 232 is about 50% to about 70% of the pixel size (or the period with which the pixels are formed). The planarizing film 233 is formed so as to cover the center lenses 232. In order to allow the center lenses 232 to function as lenses, it is ensured that the material composing the planarizing film 233 has a refractive index smaller than that of the material composing the center lens 232.

Figure 12:
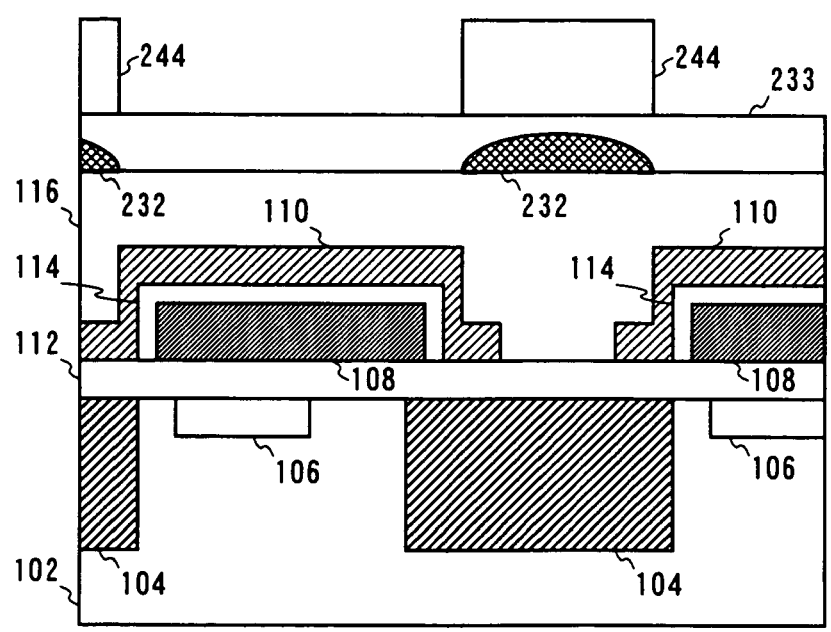
FIG. 12 is a cross-sectional view showing the substrate of FIG. 11, with a columnar-shaped resist formed thereon.
Figure 13:
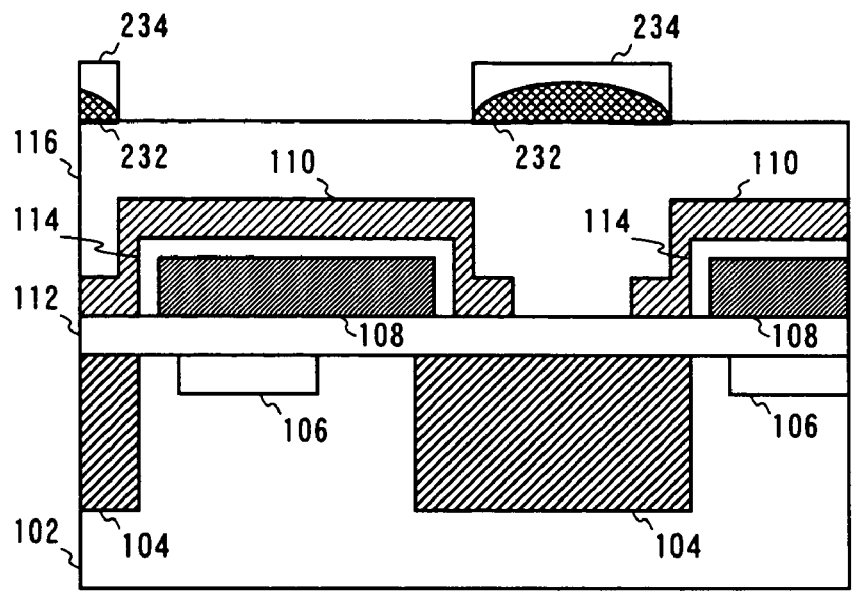
FIG. 13 is a cross-sectional view showing the substrate of FIG. 12, from which the planarizing film has been partially etched away and the resist has been removed.

FIG. 12 shows the device of FIG. 11, with a resist pattern formed thereon. The resist pattern 244 is formed in columnar portions covering the center lenses 232 from above. FIG. 13 shows the device of FIG. 12 having been etched from above. The etching is performed so as to leave the planarizing film 234 only in portions directly above the center lenses 232, while removing any other portion of the planarizing film 234. The remaining planarizing film 234 functions to prevent the center lenses 232 from being affected by subsequent steps such as etching.

Figure 14:
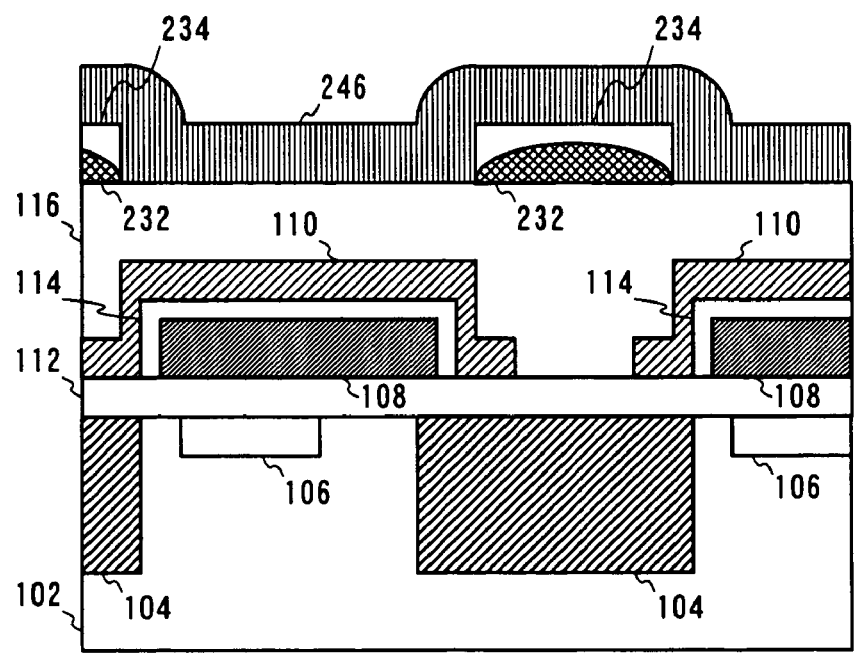
FIG. 14 is a cross-sectional view showing the substrate of FIG. 13, with a film of lens material being formed thereon.

FIG. 14 shows the device of FIG. 13, with a film of lens material 246 for composing the annular lenses 236 having been formed thereon. By employing different materials for the center lenses 232 and the annular lenses 236, it can be ensured that the center lenses 232 have a different refractive index from that of the annular lenses 236. It is known that the refractive index of SiON can be varied in the neighborhood of 1.75 to 2.3 by changing the component ratios of O and N. The method for forming the lenses is similar to that described in the first embodiment, and the description thereof is omitted. In the case where the film is to be formed of an oxygen-containing material such as SiON, it is generally considered necessary to adjust the composition of the etching gas so as to contain less oxygen.

Figure 15:
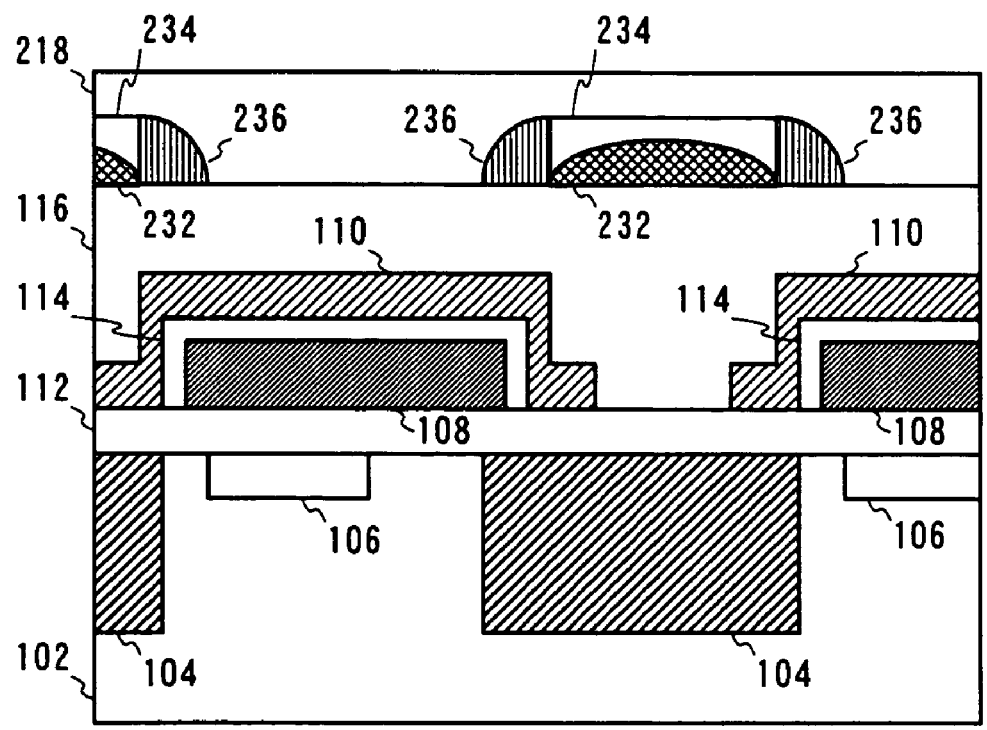
FIG. 15 is a cross-sectional view showing the substrate of FIG. 14, from which the film of lens material has been partially removed to form annular lenses, with a planarizing film being further formed thereon.

FIG. 15 shows the device of FIG. 14, where the lens material 246 has been etched to form the annular lenses 236, with a planarizing film 218 further being formed thereon. Through the etching, a side wall to become the annular lens 236 is formed around each center lens 232. The planarizing film 218 is formed so as to cover the center lenses 232 and the annular lenses 236.

The method for forming planarizing film 218, the color filter 120, and the upper lenses 122 on the device shown in FIG. 15 is similar to that used for the solid-state imaging device 100 according to the first embodiment, and the description thereof is omitted.

It will be seen that the solid-state imaging device shown in FIG. 10 additionally comprises a further annular lens 240 outside the side wall (annular lens 236) around each center lens 232 in the device show in FIG. 9. The planarizing film 238 can be formed in the same manner as the planarizing film 234. Since a material can be arbitrarily selected for each side wall to become the annular lens 240 or 236, an optimum lens can be designed using arbitrary refractive index values. For example, the refractive index of each annular lens may be increased or decreased toward the outside (beginning from the optical axis of the center lens). By thus differentiating the refractive indices of the lenses, it becomes possible to impart the intralayer lenses with various optical characteristics as necessary.

Third Embodiment

Figure 17:
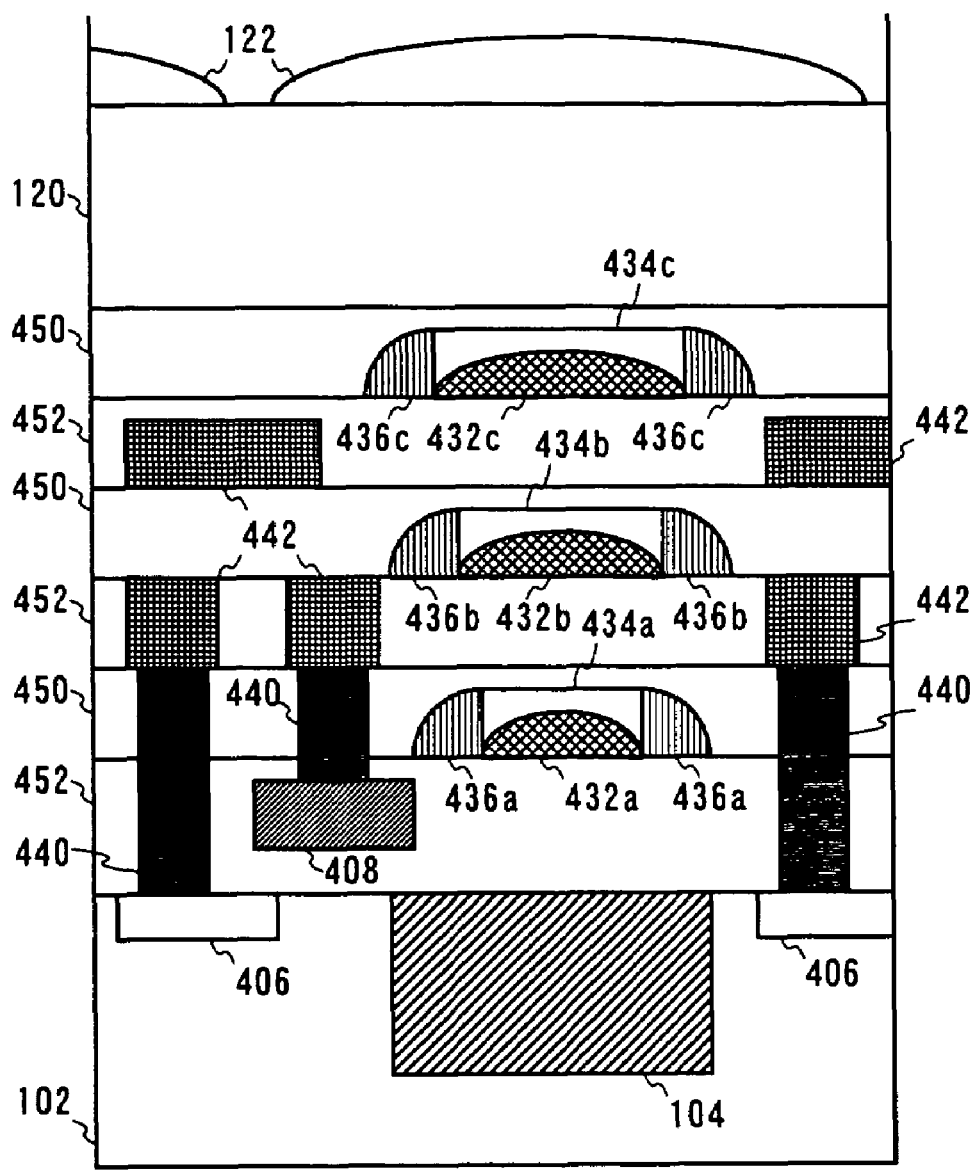
FIG. 17 is a cross-sectional view showing a MOS-type solid-state imaging device including intralayer lenses provided at the same level as the wiring.
Figure 18:
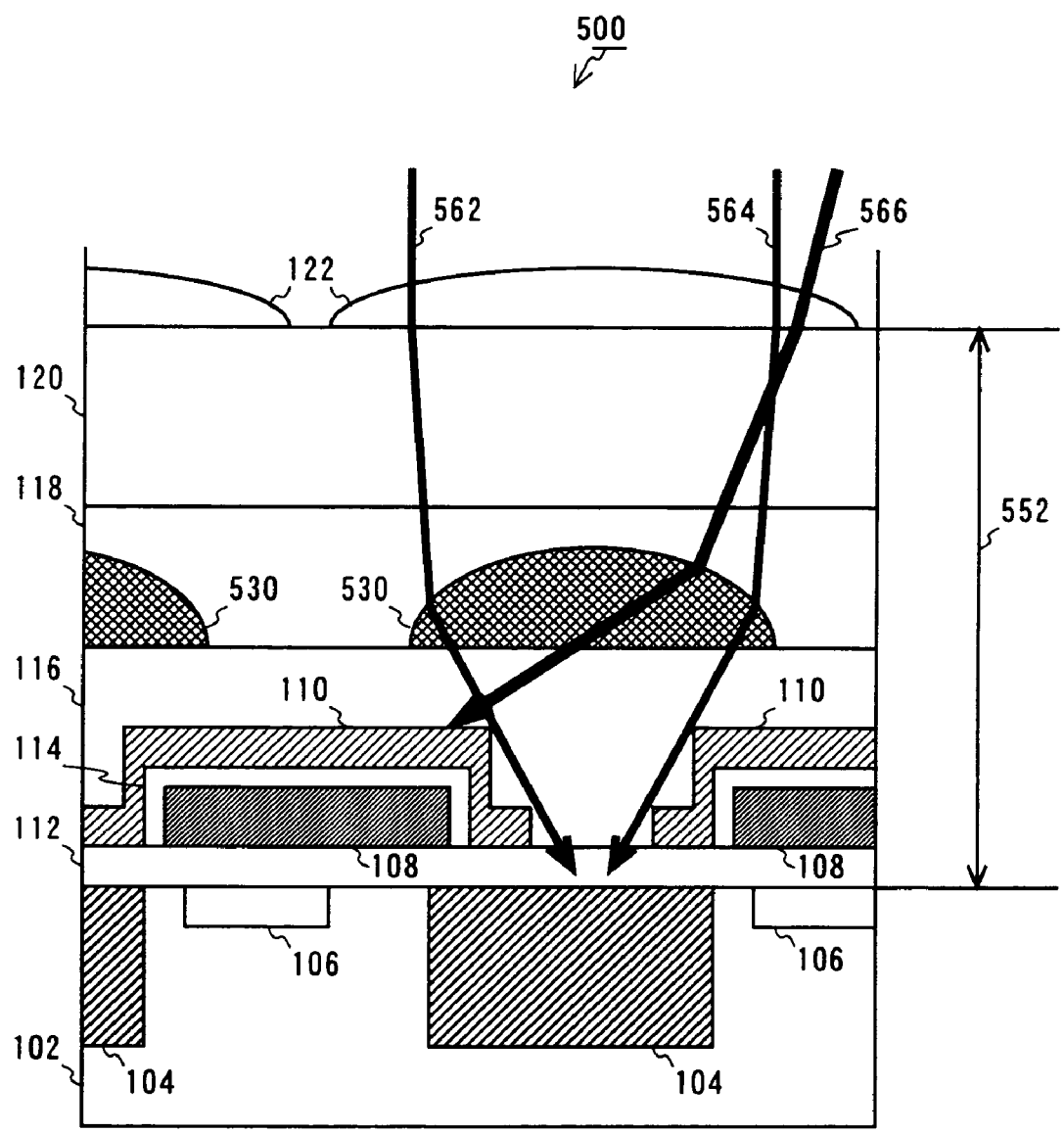
FIG. 18 is a cross-sectional view showing a conventional solid-state imaging device.

The first and second embodiments illustrated solid-state imaging devices of an interline CCD type. However, the solid-state imaging device according to the present invention may be any other CCD-type solid-state imaging device or a MOS-type imaging device. FIGS. 16 and 17 are schematic cross-sectional views each illustrating a case where a MOS imaging device of an FDA (Floating Diffusion Amp) type is adopted as the solid-state imaging device. The present embodiment is similarly applicable to any other MOS-type solid-state imaging device.

In the case of an MOS-type imaging device, in particular, multiple layers of wiring are generally employed. Therefore, in order to allow light from an external source to be efficiently converged to the photodiode sections, it is preferable to employ multiple layers of lenses. By adopting a Fresnel lens structure for the intralayer lenses, as shown in FIGS. 16 and 17, the height of the intralayer lenses can be made lowered than the thickness of each wiring layer. As a result, without being affected by the multiple layers of wiring, it becomes possible to provide the intralayer lenses between wiring layers (FIG. 16) or in the same layers as the wiring layers (FIG. 17). This makes it possible to provide more layers of intralayer lenses than there are wiring layers.

In FIG. 16, the Si substrate 102, the photodiode sections 104, the color filter 120, and the upper lenses 122 are identical to those in the first embodiment, and gate electrodes 308 have the same function as that of the gate electrodes 108 in the first embodiment. Therefore, descriptions of these elements are omitted. Charge-voltage conversion sections 306 function to convert electrical charges generated by the photodiode sections 104 to voltages, through transfer via the gate electrodes 308.

In the MOS-type solid-state imaging device, multiple layers of aluminum wiring 342 are provided. Plugs 340 are provided to electrically interconnect different pieces of aluminum wiring 342 to each other, electrically interconnect each gate electrode 308 and the aluminum wiring 342, or electrically interconnect each charge-voltage conversion section 306 and the aluminum wiring 342. An insulative film 350 is formed in order to ensure electrical insulation between the photodiode sections 104, the charge-voltage conversion sections 306, the gate electrodes 308, and the aluminum wiring 342.

A set of a center lens 332a and an annular lens 336a, and a set of a center lens 332b and an annular lens 336b, each constitutes an intralayer lens having a Fresnel lens structure. These intralayer lenses are covered by planarizing films 334a and 334b, respectively, as well as by planarizing films 352.

In FIG. 17, the Si substrate 102, the photodiode sections 104, the color filter 120, and the upper lenses 122 are identical to those in the first embodiment. Gate electrodes 408 have the same function as that of the gate electrodes 108 in the first embodiment. Charge-voltage conversion sections 406 have the same function as that of the charge-voltage conversion sections 306 in the third embodiment. Therefore, descriptions of these elements are omitted.

In the MOS-type solid-state imaging device, multiple layers of aluminum wiring 442 are provided. Plugs 440 are provided to electrically interconnect different pieces of aluminum wiring 442 to each other, electrically interconnect each gate electrode 408 and the aluminum wiring 442, or electrically interconnect each charge-voltage conversion section 406 and the aluminum wiring 442. An insulative film 450 is formed in order to ensure electrical insulation between the photodiode sections 104, the charge-voltage conversion sections 406, the gate electrodes 408, and the aluminum wiring 442.

A set of a center lens 432*a* and an annular lens 436*a*, and a set of a center lens 432*b* and an annular lens 436*b*, and a set of a center lens 432*c* and an annular lens 436*c*, each constitutes an intralayer lens having a Fresnel lens structure. These intralayer lenses are covered by planarizing films 434*a*, 434*b*, and 434*c*, respectively, as well as by planarizing films 352.

As described above, in accordance with a solid-state imaging device according to the present embodiment of the invention, intralayer lenses of a Fresnel lens structure are employed. Therefore, even if the curvature of the intralayer lenses is to be increased, the thickness thereof can be made thin, and the distance from the surface of the photoelectric conversion sections to the upper lenses can be made short. As a result, light leaking into adjoining pixels is reduced, whereby intermixing of colors is prevented. Thus, there is realized a solid-state imaging device which has reduced color unevenness and flicker. Furthermore, since light which obliquely enters the upper lenses can be efficiently converged to the photoelectric conversion sections, clear images can be obtained even with a large camera lens aperture.

While the invention has been described in detail, the foregoing description is in all aspects illustrative and not restrictive. It is understood that numerous other modifications and variations can be devised without departing from the scope of the invention.

What is claimed is:

1. A solid-state imaging device in which a pixel-by-pixel array of photoelectric conversion sections each generate an electrical charge in accordance with an amount of light entering the photoelectric conversion section, and the electrical charges generated by the photoelectric conversion sections are converted to an electrical signal to be output, comprising:

a color filter layer disposed above the photoelectric conversion sections, the color filter layer allowing light of a specific wavelength to pass therethrough;

upper lenses disposed above the color filter layer, the upper lenses causing incident light to be converged so as to enter the color filter layer; and intralayer lenses disposed between the color filter layer and the photoelectric conversion sections, each intralayer lens causing the light converged by each upper lens to be further converged so as to enter a corresponding one of the photoelectric conversion sections, wherein each intralayer lens includes a center lens having a circular and curved surface whose center is on an optical axis of the center lens and also includes at least one annular lens which is disposed on the outside of the center lens and which has an annular and belt-like face which is concentric to the center lens with respect to the optical axis, the at least one annular lens and the center lens being in contact with each other.

2. The solid-state imaging device according to claim 1, wherein a refractive index of the center lens and a refractive index of the at least one annular lens are not equal.

3. The solid-state imaging device according to claim 2, wherein a refractive index of the center lens and a refractive index of the at least one annular lens increase toward outside and away from the optical axis of the center lens.

4. The solid-state imaging device according to claim 2, wherein a refractive index of the center lens and a refractive index of the at least one annular lens decrease toward outside and away from the optical axis of the center lens.

5. The solid-state imaging device according to claim 1, wherein a width of the at least one annular lens along a radius direction thereof decreases toward outside and away from the optical axis of the center lens.

6. The solid-state imaging device according to claim 1, wherein each intralayer lens comprises SiN (silicon nitride).

* * * * *